(12) United States Patent
Yamauchi et al.

(10) Patent No.: US 10,074,389 B2
(45) Date of Patent: Sep. 11, 2018

(54) WIRED CIRCUIT BOARD

(71) Applicant: NITTO DENKO CORPORATION, Osaka (JP)

(72) Inventors: Daisuke Yamauchi, Osaka (JP); Hiroyuki Tanabe, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/800,692

(22) Filed: Nov. 1, 2017

(65) Prior Publication Data

US 2018/0122411 A1 May 3, 2018

(30) Foreign Application Priority Data

Nov. 2, 2016 (JP) ................................. 2016-214815

(51) Int. Cl.
*G11B 5/48* (2006.01)
*H05K 1/02* (2006.01)

(52) U.S. Cl.
CPC ............. *G11B 5/486* (2013.01); *H05K 1/028* (2013.01); *H05K 1/0242* (2013.01); *H05K 2201/09236* (2013.01)

(58) Field of Classification Search
None
See application file for complete search history.

(56) References Cited

U.S. PATENT DOCUMENTS

| | | | | |
|---|---|---|---|---|
| 5,606,477 A * | 2/1997 | Erpelding | ............ | G11B 5/4833 360/244.3 |
| 5,666,717 A * | 9/1997 | Matsumoto | .......... | G11B 5/3103 29/603.12 |
| 5,796,552 A * | 8/1998 | Akin, Jr. | ............. | G11B 5/4846 360/264.2 |
| 5,857,257 A * | 1/1999 | Inaba | ..................... | G11B 5/486 216/52 |
| 5,995,328 A * | 11/1999 | Balakrishnan | ....... | G11B 5/4846 360/245.9 |
| 6,275,358 B1 * | 8/2001 | Balakrishnan | ....... | G11B 5/4853 360/264.2 |
| 6,399,899 B1 * | 6/2002 | Ohkawa | ................. | H01R 13/58 174/255 |
| 6,404,594 B1 | 6/2002 | Maruyama et al. | | |
| 6,424,500 B1 * | 7/2002 | Coon | ..................... | G11B 5/486 360/245.9 |

(Continued)

FOREIGN PATENT DOCUMENTS

JP 2000-268336 A 9/2000

*Primary Examiner* — Dimary Lopez Cruz
*Assistant Examiner* — Muhammed Azam
(74) *Attorney, Agent, or Firm* — Edwards Neils LLC; Jean C. Edwards, Esq.

(57) ABSTRACT

A wired circuit board includes an insulating layer and a plurality of wires disposed at one-side surface in a thickness direction of the insulating layer at spaced intervals to each other. The plurality of wires have one pair of wires in parallel, the plurality of wires continuously have a first portion and a second portion in which the total sum of a line width of one wire of one pair of wires and an interval between one pair of wires is smaller than that of the first portion, and a thickness T1 of the first portion is large with respect to a thickness T2 of the second portion.

5 Claims, 8 Drawing Sheets

(56) References Cited

U.S. PATENT DOCUMENTS

| Patent/Pub No. | Date | Inventor | Classification |
|---|---|---|---|
| 6,841,737 B2* | 1/2005 | Komatsubara | G11B 5/4853 174/250 |
| 7,020,949 B2* | 4/2006 | Muramatsu | G11B 5/486 29/603.03 |
| 7,182,606 B2* | 2/2007 | Ishii | H05K 1/056 174/261 |
| 7,460,338 B2* | 12/2008 | Okabe | G11B 5/486 360/245.9 |
| 7,923,644 B2* | 4/2011 | Ishii | G11B 5/486 174/254 |
| 7,986,495 B2* | 7/2011 | Kamei | G11B 5/4853 174/250 |
| 8,097,811 B2* | 1/2012 | Hitomi | G06F 1/182 174/250 |
| 8,138,427 B2* | 3/2012 | Ishii | G11B 5/4853 174/254 |
| 8,169,746 B1* | 5/2012 | Rice | G11B 5/486 360/245.9 |
| 8,330,047 B2* | 12/2012 | Ho | G11B 5/486 174/250 |
| 8,895,870 B2* | 11/2014 | Ohsawa | C25D 5/02 174/261 |
| 8,917,483 B2* | 12/2014 | Sugimoto | G11B 5/484 360/245.9 |
| 9,029,712 B2* | 5/2015 | Sugimoto | H05K 1/0296 174/255 |
| 9,274,273 B2* | 3/2016 | Masuda | G02B 6/138 |
| 2003/0137775 A1* | 7/2003 | Yoon | G11B 5/4826 360/245.9 |
| 2003/0193753 A1* | 10/2003 | Arai | G11B 5/486 360/245.8 |
| 2005/0254175 A1* | 11/2005 | Swanson | G11B 5/484 360/245.9 |
| 2006/0023435 A1* | 2/2006 | Ooyabu | H05K 1/181 361/760 |
| 2006/0092572 A1* | 5/2006 | Kiyono | G11B 5/4853 360/245.9 |
| 2006/0202357 A1* | 9/2006 | Kanagawa | G11B 5/4846 257/784 |
| 2007/0222052 A1* | 9/2007 | Kabumoto | H01L 23/50 257/679 |
| 2007/0253176 A1* | 11/2007 | Ishii | G11B 5/486 361/760 |
| 2008/0029293 A1* | 2/2008 | Ooyabu | G11B 5/486 174/250 |
| 2008/0115962 A1* | 5/2008 | Juni | G02B 6/1221 174/250 |
| 2008/0192384 A1* | 8/2008 | Danielson | G11B 5/486 360/245.9 |
| 2009/0032299 A1* | 2/2009 | Khan | G11B 5/02 174/261 |
| 2009/0101399 A1* | 4/2009 | Iguchi | G11B 5/486 174/260 |
| 2009/0116150 A1* | 5/2009 | Ohsawa | G11B 5/486 360/245.9 |
| 2009/0285524 A1* | 11/2009 | Ishii | G02B 6/4296 385/14 |
| 2010/0000774 A1* | 1/2010 | Naito | G02B 6/43 174/260 |
| 2010/0002985 A1* | 1/2010 | Ishii | G11B 5/486 385/14 |
| 2010/0002986 A1* | 1/2010 | Naito | G11B 5/486 385/14 |
| 2010/0032201 A1* | 2/2010 | Ooyabu | G11B 5/484 174/262 |
| 2010/0033875 A1* | 2/2010 | Yoshida | G11B 5/4833 360/244.1 |
| 2010/0110590 A1* | 5/2010 | Ohsawa | G11B 5/4853 360/234.5 |
| 2010/0110649 A1* | 5/2010 | Ohsawa | G11B 5/486 361/760 |
| 2010/0118433 A1* | 5/2010 | Buch | B82Y 10/00 360/75 |
| 2010/0118445 A1* | 5/2010 | Ohsawa | G11B 5/4833 360/246.2 |
| 2010/0188779 A1* | 7/2010 | Ohsawa | G11B 5/4853 360/246.1 |
| 2010/0224391 A1* | 9/2010 | Tamura | G03F 1/144 174/250 |
| 2011/0058347 A1* | 3/2011 | Ihara | G11B 5/484 361/802 |
| 2011/0091152 A1* | 4/2011 | Nishio | H05K 1/0274 385/14 |
| 2011/0109407 A1* | 5/2011 | Horie | H01P 3/006 333/238 |
| 2011/0123145 A1* | 5/2011 | Nishio | G11B 5/486 385/14 |
| 2011/0126221 A1* | 5/2011 | Kitayama | G11B 17/056 720/600 |
| 2011/0286132 A1* | 11/2011 | Ishii | G11B 5/486 360/246.2 |
| 2012/0087041 A1* | 4/2012 | Ohsawa | G11B 5/4826 360/234.5 |
| 2012/0092794 A1* | 4/2012 | Ohsawa | G11B 5/486 360/246.2 |
| 2012/0092836 A1* | 4/2012 | Ohsawa | G11B 5/486 361/748 |
| 2012/0193127 A1* | 8/2012 | Ishigaki | G11B 5/4846 174/251 |
| 2012/0247824 A1* | 10/2012 | Ohsawa | G11B 5/486 174/264 |
| 2013/0170076 A1* | 7/2013 | Higuchi | G11B 21/02 360/294 |
| 2013/0215726 A1* | 8/2013 | Fujimura | G11B 21/16 369/13.24 |
| 2014/0153373 A1* | 6/2014 | Fujimura | G11B 5/4826 369/13.32 |
| 2014/0160599 A1* | 6/2014 | Higuchi | G11B 5/486 360/294.4 |
| 2014/0313619 A1* | 10/2014 | Sugimoto | G11B 5/484 360/245.8 |
| 2014/0345920 A1* | 11/2014 | Ihara | H05K 3/3405 174/257 |
| 2015/0156892 A1* | 6/2015 | Tanabe | H05K 3/4661 205/125 |
| 2015/0187377 A1* | 7/2015 | Fujimura | G11B 5/4833 360/244.1 |
| 2015/0189742 A1* | 7/2015 | Tanabe | G11B 5/484 174/255 |
| 2015/0305156 A1* | 10/2015 | Fujimura | H05K 1/056 174/260 |
| 2016/0035968 A1* | 2/2016 | Sakakura | H01L 41/313 29/25.35 |
| 2016/0057867 A1* | 2/2016 | Yamauchi | H05K 1/056 29/850 |
| 2016/0105954 A1* | 4/2016 | Sugimoto | H05K 1/0271 174/251 |
| 2016/0234936 A1* | 8/2016 | Okuno | G11B 5/60 |
| 2016/0314808 A1* | 10/2016 | Iwahara | G11B 5/4846 |
| 2018/0124912 A1* | 5/2018 | Yamauchi | H05K 1/028 |

\* cited by examiner

WIRED CIRCUIT BOARD

CROSS-REFERENCE TO RELATED APPLICATION

The present application claims priority from Japanese Patent Application No. 2016-214815 filed on Nov. 2, 2016, the contents of which are hereby incorporated by reference into this application.

BACKGROUND OF THE INVENTION

Field of the Invention

The present invention relates to a wired circuit board such as a suspension board with circuit preferably provided in a hard disk drive.

Description of Related Art

Conventionally, a magnetic disk device such as a hard disk drive is provided with a magnetic recording medium, a suspension board with circuit mounted with a magnetic head provided facing thereto, and an integrated circuit device connected to the suspension board with circuit, and in the magnetic disk device, a large amount of data is read and written onto the magnetic recording medium at high speed.

As such a suspension board with circuit provided in a magnetic disk device, for example, an insulated suspension including electric wires consisting of one pair of recording electric wires and one pair of reproducing electric wires has been proposed (ref: for example, Japanese Unexamined Patent Publication No. 2000-268336).

In the insulated suspension described in Patent Document 1, a width of each of one pair of reproducing electric wires is large with respect to that of each of one pair of recording electric wires, and an interval between one pair of reproducing electric wires is large with respect to that between one pair of recording electric wires. Meanwhile, a thickness of one pair of reproducing electric wires is small with respect to that of one pair of recording electric wires.

In this manner, in the insulated suspension described in Patent Document 1, a difference of the characteristic impedance between the reproducing electric wire and the recording electric wire is reduced.

SUMMARY OF THE INVENTION

Recently, in order to achieve an increase in speed and capacity enlargement of the magnetic disk, a suspension board with circuit is required to achieve broadband. Thus, for example, an increase in a width of the wire and an interval therebetween, and an increase in a thickness thereof are considered.

However, in view of ensuring the elasticity of the insulated suspension, it may be difficult to simply achieve the increase in the width of the wire and the interval therebetween, and the increase in the thickness thereof. Furthermore, the device may be enlarged in size.

An object of the present invention is to provide a wired circuit board capable of ensuring excellent elasticity, achieving miniaturization of a device, and achieving broadband of a wire.

The present invention [1] includes a wired circuit board including an insulating layer and a plurality of wires disposed at one-side surface in a thickness direction of the insulating layer at spaced intervals to each other, wherein the plurality of wires have one pair of wires in parallel, the plurality of wires continuously have a first portion and a second portion in which the total sum of a line width of one wire of one pair of wires and an interval between one pair of wires is smaller than that of the first portion, and a thickness $T1$ of the first portion is large with respect to a thickness $T2$ of the second portion.

According to the wired circuit board, in the first portion, the total sum of the line width of one wire of one pair of wires and the interval between one pair of wires is larger than that of the second portion, and the thickness $T1$ of the first portion is large with respect to the thickness $T2$ of the second portion, so that the broadband can be achieved.

According to the wired circuit board, in the second portion, the above-described total sum is smaller than that of the first portion, and the thickness $T2$ of the second portion is small with respect to the thickness $T1$ of the first portion, so that excellent elasticity is ensured and the miniaturization of the device can be achieved.

As a result, in the wired circuit board, both the broadband and excellent elasticity can be achieved.

The present invention [2] includes the wired circuit board described in [1], wherein the total sum of the first portion is above 35 μm.

In the wired circuit board, the total sum of the line width of one wire and the interval between the wires in the first portion is above 35 μm, so that the broadband can be improved.

The present invention [3] includes the wired circuit board described in [1] or [2], wherein the total sum of the second portion is 35 μm or less.

In the wired circuit board, the total sum of the line width of one wire and the interval between the wires in the second portion is 35 μm or less, so that excellent elasticity can be ensured.

The present invention [4] includes the wired circuit board described in any one of [1] to [3], wherein the ratio ($T1/T2$) of the thickness $T1$ to the thickness $T2$ is 1.1 or more.

The wired circuit board can further more surely achieve both the broadband and excellent elasticity in the second portion.

The present invention [5] includes the wired circuit board described in any one of [1] to [4], wherein the thickness $T1$ is above 7 μm and the thickness $T2$ is 7 μm or less.

The wired circuit board can further more surely achieve both the broadband and excellent elasticity in the second portion.

The wired circuit board of the present invention can achieve both the broadband and excellent elasticity.

DETAILED DESCRIPTION OF THE INVENTION

One Embodiment

A suspension board with circuit that is one embodiment of a wired circuit board of the present invention is described with reference to FIGS. 1 to 4.

Figure 1:
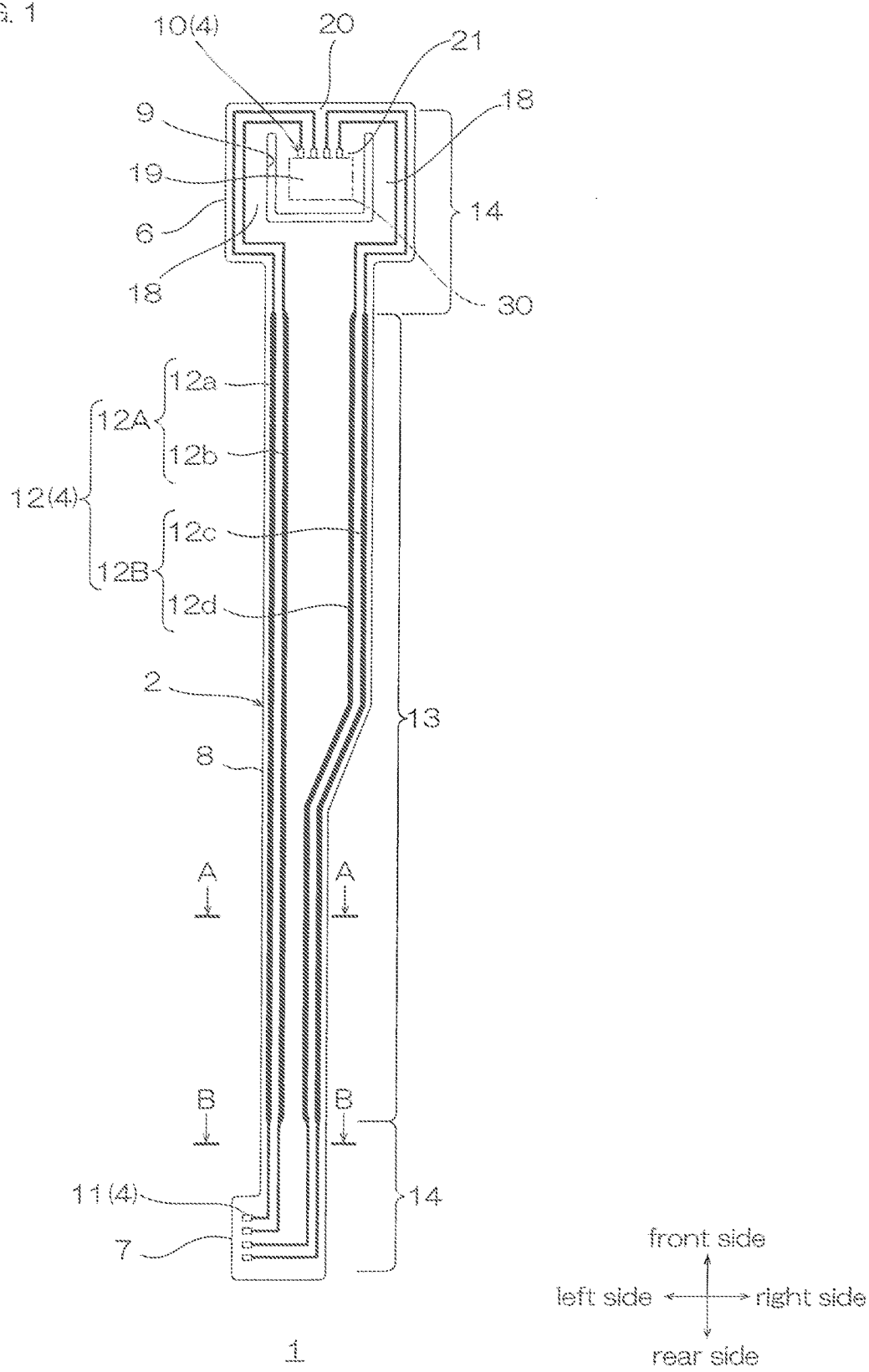
FIG. 1 shows a plan view of a suspension board with circuit that is one embodiment of a wired circuit board of the present invention.
Figure 4:
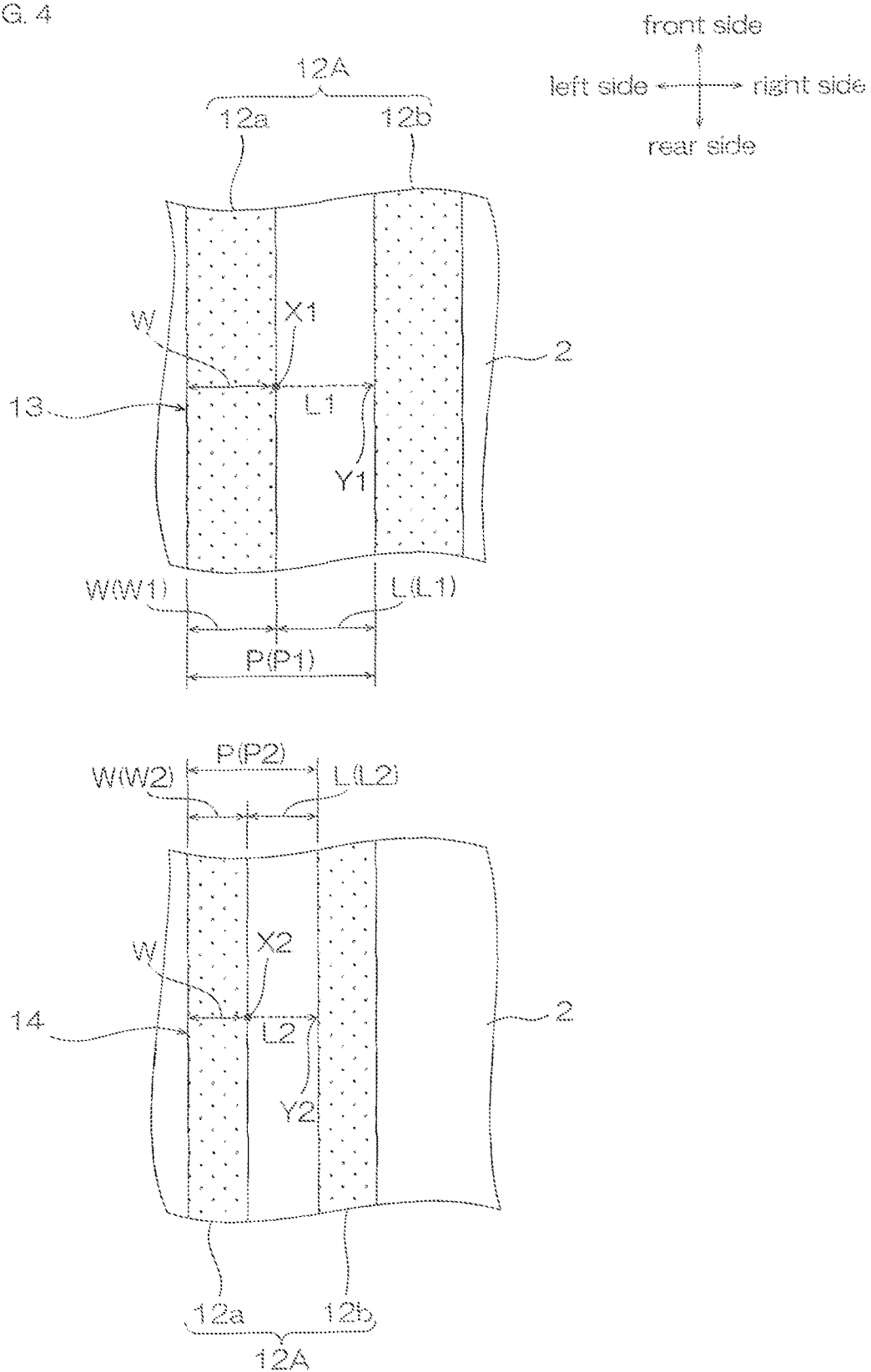
FIG. 4 shows a partially enlarged plan view of first one pair of wires in the suspension board with circuit shown in FIG. 1, and the upper-side view is a plan view corresponding to FIG. 2 and the lower-side view is a plan view corresponding to FIG. 3.

In FIGS. 1 and 4, a base insulating layer 3 and a cover insulating layer 5 to be described later are omitted so as to clearly show the arrangement of a plurality of wires 12 to be described later.

Figure 2:
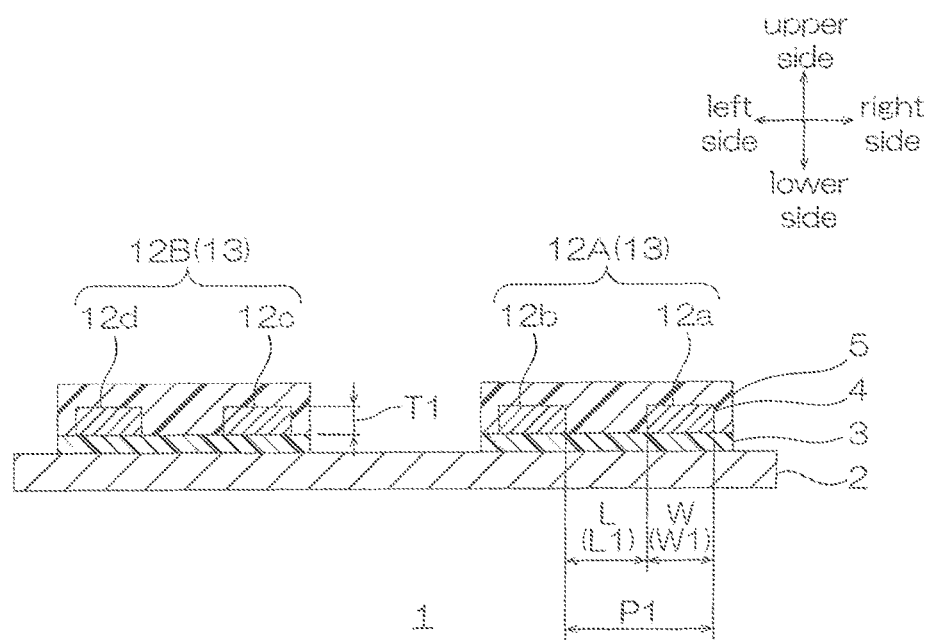
FIG. 2 shows a cross-sectional view along an A-A line in a midway region of a board intermediate portion of the suspension board with circuit shown in FIG. 1.
Figure 3:
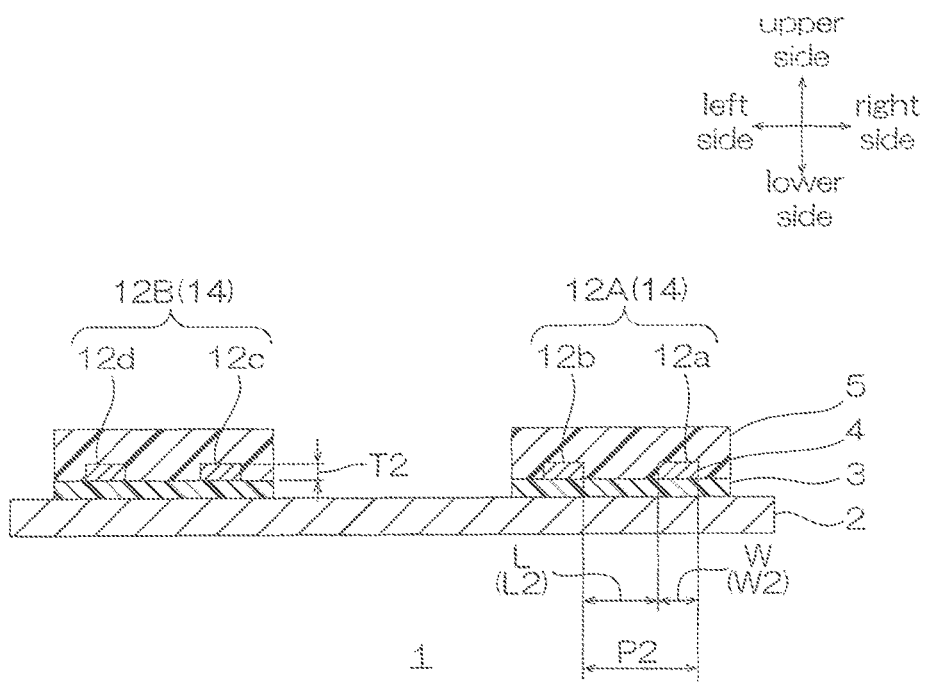
FIG. 3 shows a cross-sectional view along a B-B line in a rear end portion of the board intermediate portion of the suspension board with circuit shown in FIG. 1.

As shown in FIG. 1, a suspension board with circuit 1 has a generally flat plate (sheet) shape extending in a longitudinal direction. As shown in FIGS. 2 and 3, the suspension board with circuit 1 sequentially includes a metal supporting board 2, the base insulating layer 3 as one example of an insulating layer, a conductive layer 4, and the cover insulating layer 5 in an up-down direction (one example of a thickness direction).

The metal supporting board 2 has a shape corresponding to the outer shape of the suspension board with circuit 1. As shown in FIG. 1, the metal supporting board 2 continuously has a board intermediate portion 8, a board front end portion 6, and a board rear end portion 7.

The board intermediate portion 8 is disposed midway in the longitudinal direction (front-rear direction) of the metal supporting board 2. The board intermediate portion 8 has a generally rectangular shape when viewed from the top extending in the front-rear direction.

The board front end portion 6 is disposed in the front end portion of the metal supporting board 2. The board front end portion 6 is continuous to the front end edge of the board intermediate portion 8. The board front end portion 6 has a length in a right-left direction that is long with respect to the length in the right-left direction (direction perpendicular to the thickness and front-rear directions) of the board intermediate portion 8. The board front end portion 6 has a generally rectangular shape when viewed from the top that protrudes from the front end edge of the board intermediate portion 8 toward both outer sides in the right-left direction.

The board front end portion 6 has an opening portion 9 in a generally U-shape that passes through the metal supporting board 2 in the thickness direction and opens toward the front side when viewed from the top.

Furthermore, the board front end portion 6 integrally has two outrigger portions 18 that are disposed at both outer-side portions in the right-left direction of the opening portion 9, a mounting portion 19 that is disposed at the inside of the opening portion 9, a wire folded portion 20 that is disposed at the front side of the opening portion 9, and a terminal disposed portion 21 that is disposed between the mounting portion 19 and the wire folded portion 20.

Each of the two outrigger portions 18 extends in the front-rear direction.

The mounting portion 19 is a region in a generally rectangular shape when viewed from the top. In the mounting portion 19, a slider 30 (phantom lines) on which a magnetic head (not shown) is mounted is mounted.

The wire folded portion 20 connects the front end portions of the two outrigger portions 18 in the right-left direction.

The terminal disposed portion 21 is a region in a generally rectangular shape when viewed from the top extending in the right-left direction.

The board rear end portion 7 is disposed in the rear end portion of the metal supporting board 2. The board rear end portion 7 is continuous to the rear end edge of the board intermediate portion 8. The board rear end portion 7 has a generally rectangular shape when viewed from the top extending from the rear end edge of the board intermediate portion 8 to be described later rearwardly. The board intermediate portion 8 has a shape in which the left end portion thereof protrudes leftwardly in a generally rectangular shape when viewed from the top.

The metal supporting board 2 is, for example, made of a metal material such as stainless steel, 42-alloy, aluminum, copper-beryllium, and phosphor bronze. The metal supporting board 2 has a thickness of, for example, 5 µm or more, preferably 10 µm or more, and for example, 30 µm or less, preferably 25 µm or less. The metal supporting board 2 has the same thickness over the entire front-rear direction including a first portion 13 and a second portion 14 to be described later.

As shown in FIGS. 2 and 3, the base insulating layer 3 is disposed on the upper surface of the metal supporting board 2. The base insulating layer 3 has a pattern including the conductive layer 4 to be described next when viewed from the top. The base insulating layer 3 is, for example, made of an insulating material such as a synthetic resin including polyimide resin, polyamide imide resin, acrylic resin, polyether nitrile resin, polyether sulfone resin, polyethylene terephthalate resin, polyethylene naphthalate resin, and polyvinyl chloride resin. The base insulating layer 3 has a thickness of for example, 1 µm or more, preferably 3 µm or more, and for example, 35 µm or less, preferably 30 µm or less. The base insulating layer 3 has the same thickness over the entire front-rear direction including the first portion 13 and the second portion 14.

The conductive layer 4 is disposed on the upper surface of the base insulating layer 3. As shown in FIG. 1, the conductive layer 4 continuously includes a plurality (four pieces) of head-side terminals 10, a plurality (four pieces) of tail-side terminals 11, and the plurality of wires 12.

The plurality of head-side terminals 10 are disposed at the terminal disposed portion 21 in the board front end portion 6. The plurality of head-side terminals 10 are disposed in parallel at spaced intervals to each other in the right-left direction.

The plurality of tail-side terminals 11 are disposed in the board rear end portion 7. To be specific, the plurality of tail-side terminals 11 are disposed in the left end portion of the board rear end portion 7 along the front-rear direction. The plurality of tail-side terminals 11 are disposed in parallel at spaced intervals to each other in the front-rear direction.

The plurality of wires 12 are disposed over the board front end portion 6, the board intermediate portion 8, and the board rear end portion 7. Each of the plurality of wires 12 connects each of the plurality of head-side terminals 10 to each of the plurality of tail-side terminals 11 when viewed from the top. The plurality of wires 12 are disposed in opposed relation at spaced intervals to each other in the right-left direction in the board intermediate portion 8. In the plurality of wires 12, two pairs of wires 12 in parallel (first left wire 12a, first right wire 12b, second right wire 12c, and second left wire 12d to be described later) are disposed in both end portions in the right-left direction in the board intermediate portion 8. To be specific, first one pair of wires 12A in parallel (the first left wire 12a disposed at the leftmost side and the first right wire 12b disposed at the right side thereof) are disposed in the left end portion of the board intermediate portion 8. Also, second one pair of wires 12B in parallel (the second right wire 12c disposed at the rightmost side and the second left wire 12d disposed at the left side thereof) are disposed in the right end portion of the board intermediate portion 8.

The plurality of wires 12 are differential wires that transmit differential signals (read signals and/or write signals). To be specific, the first one pair of wires 12A are the read wires that transmit read signals. The second one pair of wires 12B are the write wires that transmit write signals.

The differential wires can include, for example, interleave wires described in Japanese Unexamined Patent Publications No. 2016-167334 and No. 2016-6705, and wires used in TDMR (two dimensional magnetic recording).

The first one pair of wires 12A (the first left wire 12a and the first right wire 12b) extend from the two tail-side terminals 11 that are disposed at the back side rightwardly; next, bend forwardly; and then, traverse vertically the board intermediate portion 8 to reach the board front end portion 6. The first one pair of wires 12A bend leftwardly in the rear-side portion of the opening portion 9 of the board front end portion 6; subsequently, extend forwardly in the left-side outrigger portion 18; then, bend rightwardly in the wire folded portion 20; and subsequently, bend rearwardly (are folded back) in the central portion in the right-left direction of the wire folded portion 20 to finally reach the two head-side terminals 10 that are disposed at the left side.

The second one pair of wires 12B (the second right wire 12c and the second left wire 12d) extend from the two tail-side terminals 11 that are disposed at the rear side rightwardly; next, bend forwardly; and then, traverse vertically the board intermediate portion 8 to reach the board front end portion 6. The second one pair of wires 12B bend rightwardly in the rear-side portion of the opening portion 9 of the board front end portion 6; subsequently, extend forwardly in the right-side outrigger portion 18; then, bend leftwardly in the wire folded portion 20; and subsequently, bend rearwardly (are folded back) in the central portion in the right-left direction of the wire folded portion 20 to finally reach the two head-side terminals 10 that are disposed at the right side.

The conductive layer 4 is, for example, made of a conductive material such as copper, nickel, gold, solder or an alloy thereof. The size (thickness, line width, or the like) of the conductive layer 4 and the interval between the wires 12 are described later.

As shown in FIGS. 2 and 3, the cover insulating layer 5 is disposed on the upper surface of the base insulating layer 3 so as to cover the wires 12. The cover insulating layer 5 is disposed on the upper surface of the wires 12 so as to expose the head-side terminals 10 and the tail-side terminals 11. The cover insulating layer 5 is made of the same insulating material as that of the base insulating layer 3. The cover insulating layer 5 has a thickness of, for example, 1 μm or more, preferably 3 μm or more, and for example, 40 μm or less, preferably 10 μm or less. The cover insulating layer 5 has the same thickness over the entire front-rear direction including the first portion 13 and the second portion 14.

As shown in FIGS. 1 and 4, the plurality of wires 12 continuously have the first portion 13 having a relatively large total sum (pitch) P1 of a line width W of one wire 12 of one pair of wires 12 and an interval L between one pair of wires 12, and the second portion 14 having a relatively small total sum (pitch) P2 described above.

The line width W of the wire 12 is a width of the wire 12 in a direction perpendicular to the direction in which the wire 12 extends, and also a crossing length traversing the wire 12 in the shortest distance.

An interval between one pair of wires 12 is a crossing length traversing one pair of wires 12 that are next to each other in the shortest distance.

The total sum (pitch) P of the above-described line width of the wire 12 and the above-described interval between one pair of wires 12 is obtained as follows. First, the line width W of one wire (for example, the first left wire 12a) is determined. Next, a shortest-distance portion Y (Y1, Y2, and so on) in the other wire (for example, the first right wire 12b) that is positioned in the shortest distance from a determined portion X (X1, X2, and so on) in which the line width W is determined in one wire α (width direction perpendicular to the longitudinal direction in one wire α, and the end edge facing the other wire β in the width direction) is determined, and a length (interval) L (L1, L2, and so on) from the determined portion X to the shortest-distance portion Y is obtained. Thereafter, the above-described line width W is added to the above-described length L corresponding to the line width W, so that the above-described total sum (pitch) P is obtained. The above-described first portion 13 and the above-described second portion 14 in one pair of wires 12 are defined with the pitch P as a reference.

The plurality of wires 12 have the first portion 13 and the second portion 14 corresponding to the first one pair of wires 12A. The plurality of wires 12 have the first portions 13 and the second portions 14 corresponding to the second one pair of wires 12B. Accordingly, the plurality of wires 12 have the first portions 13 in the first one pair of wires 12A and the second one pair of wires 12B, and the second portions 14 in the first one pair of wires 12A and the second one pair of wires 12B.

The first portion 13 corresponding to the first one pair of wires 12A and the first portion 13 corresponding to the second one pair of wires 12B are disposed at substantially the same position when projected in the right-left direction. The second portion 14 corresponding to the first one pair of wires 12A and the second portion 14 corresponding to the second one pair of wires 12B are disposed at substantially the same position when projected in the right-left direction.

The details of the second one pair of wires 12B are omitted, and the details of the first one pair of wires 12A are described in the following.

The first portion 13 is included in the board intermediate portion 8 when viewed from the top. To be specific, the first portion 13 is disposed over the region excluding the front end portion and the rear end portion of the board intermediate portion 8 (midway region between the front end portion and the rear end portion of the board intermediate portion 8).

The first portion 13 is a portion in which the pitch (the total sum of the line width of the wire 12 and the interval therebetween) in the first one pair of wires 12A is relatively large. By the first portion 13, the broadband of the suspension board with circuit 1 is ensured. The first portion 13 is a portion that requires mechanical properties such as rigidity in the suspension board with circuit 1. The first portion 13 is also a portion that allows getting relatively thick.

A percentage of the total length of the first portion 13 with respect to the total length of the first portion 13 and the total length of the second portion 14 is, for example, 40% or more, preferably 50% or more, further more preferably 60% or more, and for example, 95% or less. When the percentage of the total length of the first portion 13 is the above-described lower limit or more, the rigidity of the suspension board with circuit 1 can be ensured.

Each of the line width of the first one pair of wires 12A in the first portion 13 (in the first one pair of wires 12A, each of a line width W1 of the first left wire 12a and the line width of the first right wire 12b) is, for example, 8 μm or more, preferably 15 μm or more, more preferably 20 μm or more, and for example, 200 μm or less. The line width W1 of the first left wire 12a and the line width of the first right wire 12b are, for example, the same. The first portion 13 has the same line width W1 in the direction (the front-rear direction) in which the wire 12 extends.

An interval L1 between the first one pair of wires 12A in the first portion 13 is, for example, 8 μm or more, preferably 10 μm or more, more preferably 12 μm or more, and for example, 50 μm or less. The first portion 13 has the same interval L1 in the direction (the front-rear direction) in which the wire 12 extends.

The above-described total sum (the pitch, to be specific, the total sum of the line width W of the first left wire 12a and the interval L between the first left wire 12a and the first right wire 12b) P1 in the first one pair of wires 12A in the first portion 13 is, in view of further more achieving the broadband of the suspension board with circuit 1, for example, 25 μm or more, preferably 30 μm or more, more preferably 35 μm or more, further more preferably above 35 μm, and for example, 250 μm or less.

As shown in FIG. 2, the thickness T1 of the first portion 13 is adjusted relatively large so as to achieve the broadband of the suspension board with circuit 1. To be specific, the thickness T1 of the first portion 13 is, for example, above 8 μm, preferably 9 μm or more, more preferably 10 μm or more, and for example, 50 μm or less, preferably 25 μm or less. The first portion 13 has the same thickness T1 in the direction (the front-rear direction) in which the wire 12 extends.

The cross-sectional area (that is, the value obtained by multiplying the above-described thickness T1 by the line width W) along the thickness direction and the right-left direction of the first portion 13 is, for example, 64 μm$^2$ or more, preferably 120 μm$^2$ or more, more preferably 150 μm$^2$ or more, and for example, 2400 μm$^2$ or less.

Meanwhile, as shown in FIG. 1, the second portion 14 is a portion that requires elasticity, to be specific, plasticity, flexibility, or the like in the suspension board with circuit 1. Furthermore, the second portion 14 is a portion that requires miniaturization, to be specific, thinning.

The second portion 14 is included in the board front end portion 6, the board rear end portion 7, and the board intermediate portion 8 when viewed from the top. To be specific, each of the second portions 14 is disposed at each of both sides in the front-rear direction of the first portion 13, and each of the two second portions 14 continues to each of the front end edge and the rear end edge of the first portion 13. To be more specific, the front-side second portion 14 is continuously disposed at the front end portion of the board intermediate portion 8, the rear-side portion with respect to the opening portion 9 in the board front end portion 6, the outrigger portion 18, and the wire folded portion 20. The rear-side second portion 14 is continuously disposed at the rear end portion of the board intermediate portion 8 and the board rear end portion 7.

The second portion 14 is a portion in which the pitch P2 in the first one pair of wires 12A is narrow (small) with respect to the pitch P1 of the first portion 13.

A percentage of the total length of the second portion 14 with respect to the total length of the first portion 13 and the total length of the second portion 14 is, for example, 60% or less, preferably 50% or less, further more preferably 40% or less, and for example, 5% or more. When the above-described percentage of the second portion 14 is the above-described upper limit or less, the elasticity of the second portion 14 is improved and the miniaturization of the device can be achieved by disposing the second portion 14 in only the minimum portion that requires improvement of the elasticity and the miniaturization of the device, while the broadband of the suspension board with circuit 1 can be sufficiently achieved.

As shown in FIGS. 3 and 4, each of the line widths of the first one pair of wires 12A in the second portion 14 (in the first one pair of wires 12A, each of a line width W2 of the first left wire 12a and the line width of the first right wire 12b) is, for example, small with respect to each of the line widths of the first one pair of wires 12A in the first portion 13. To be specific, each of the line widths of the first one pair of wires 12A in the second portion 14 is, for example, 20 μm or less, preferably 15 μm or less, more preferably 10 μm or less, and for example, 6 μm or more. The ratio (for example, the ratio of the line width W1 of the first left wire 12a in the first portion 13 to the line width W2 of the first left wire 12a in the second portion 14, that is, W1/W2) of each of the line widths of the first one pair of wires 12A in the first portion 13 to each of the line widths of the first one pair of wires 12A in the second portion 14 is, for example, 1.2 or more, preferably 1.35 or more, more preferably 1.5 or more, and for example, 10 or less.

The second portion 14 has the same line width W2 in the direction in which the wire 12 extends.

An interval L2 between the first one pair of wires 12A in the second portion 14 is small with respect to the interval L1 between the first one pair of wires 12A in the first portion 13. To be specific, the interval L2 between the first one pair of wires 12A in the second portion 14 is, for example, 30 μm or less, preferably 20 μm or less, more preferably 15 μm or less, and for example, 6 μm or more. The ratio (L1/L2) of the interval L1 between the first one pair of wires 12A in the first portion 13 to the interval L2 between the first one pair of wires 12A in the second portion 14 is, for example, 1.2 or more, preferably 1.35 or more, more preferably 1.5 or more, and for example, 10 or less.

The second portion 14 has the same interval L2 in the direction in which the wire 12 extends.

The above-described total sum (pitch) in the first one pair of wires 12A in the second portion 14, to be specific, the total sum P2 of the line width W2 of the first left wire 12a and the interval L2 between the first one pair of wires 12A is, in view of further more improvement of excellent elasticity of the second portion 14, for example, 35 μm or less, preferably 25 μm or less, and for example, 12 μm or more.

The ratio (P1/P2) of the pitch P1 of the first portion 13 to the pitch P2 of the second portion 14 is, for example, 1.2 or more, preferably 1.35 or more, more preferably 1.5 or more, and for example, 10 or less.

As shown in FIGS. 2 and 3, the thickness T2 of the second portion 14 is smaller than the thickness T1 of the first portion 13.

To be specific, in view of further more improvement of excellent elasticity of the second portion 14 and achieving the miniaturization of the device, the thickness T2 of the second portion 14 is, for example, 8 μm or less, preferably 7 μm or less, more preferably 6 μm or less, and for example, 1 μm or more, preferably 3 μm or more.

The second portion 14 has the same thickness T2 in the direction in which the wire 12 extends.

The ratio (T1/T2) of the thickness T1 of the first portion 13 to the thickness T2 of the second portion 14 is above 1, and for example, 1.1 or more, more preferably 1.2 or more, further more preferably 1.3 or more, particularly preferably 1.5 or more, and for example, 5 or less, preferably 3 or less, more preferably 2 or less.

When the ratio (T1/T2) of the thickness T1 of the first portion 13 to the thickness T2 of the second portion 14 is the above-described lower limit or more, both the broadband of the suspension board with circuit 1 and excellent elasticity of the second portion 14 can be further more surely achieved.

The cross-sectional area (that is, the value obtained by multiplying the above-described thickness T2 by the line width W) along the thickness direction and the right-left direction of the second portion 14 is, for example, 240 μm$^2$ or less, preferably 150 μm$^2$ or less, more preferably 120 μm$^2$ or less, and for example, 6 μm$^2$ or more.

When the cross-sectional area of the second portion 14 is the above-described upper limit or less, excellent elasticity of the second portion 14 is ensured, and the miniaturization of the second portion 14 can be achieved.

The ratio of the cross-sectional area of the first portion 13 to that of the second portion 14 is, for example, 1.2 or more, preferably 1.3 or more, more preferably 1.5 or more, and for example, 50 or less.

The thickness of the head-side terminal 10 and the tail-side terminal 11 is the same as the thickness T1 of the first portion 13. The size of the head-side terminal 10 and the tail-side terminal 11 when viewed from the top is appropriately set in accordance with its usages and purpose.

To produce the suspension board with circuit 1, first, the metal supporting board 2 is prepared, next, the base insulating layer 3 is disposed on the upper surface of the metal supporting board 2, and thereafter, the conductive layer 4 is disposed on the upper surface of the base insulating layer 3. At this time, for example, the wire 12 having two different thickness of the thickness T1 and the thickness T2 is formed by a twice plating method and a half etching method described in Japanese Unexamined Patent Publication No. 2006-310491. Thereafter, the cover insulating layer 5 is disposed on the base insulating layer 3 so as to cover the wire 12, and the head-side terminal 10 and the tail-side terminal 11 (not shown in FIGS. 2 and 3).

Thereafter, as referred to FIG. 1, the slider 30 (phantom lines) is mounted on the mounting portion 19 of the board front end portion 6, and an external board that is not shown is mounted on the board rear end portion 7.

According to the suspension board with circuit 1, the total sum (pitch) P1 of the line width W of the first left wire 12a of the first one pair of wires 12A, and the interval L between the first one pair of wires 12A is relatively large, and the thickness T1 of the first portion 13 is large with respect to the thickness T2 of the second portion 14, so that the first portion 13 can correspond to the broadband. Also, the first portion 13 has excellent mechanical properties.

According to the suspension board with circuit 1, the above-described total sum (pitch) P2 of the second portion 14 is small with respect to the total sum (pitch) P1 of the first portion 13, and the thickness T2 of the second portion 14 is small with respect to the thickness T1 of the first portion 13, so that excellent elasticity in the second portion 14 can be ensured and the miniaturization of the second portion 14 can be achieved.

In the suspension board with circuit 1, when the total sum (pitch) P1 of the first portion 13 is above 35 μm, the broadband can be improved.

In the suspension board with circuit 1, when the total sum (pitch) P2 of the second portion 14 is 35 μm or less, excellent elasticity can be ensured.

In the suspension board with circuit 1, when the ratio (T1/T2) of the thickness T1 of the first portion 13 to the thickness T2 of the second portion 14 is 1.1 or more, both the broadband of the suspension board with circuit 1 and excellent elasticity of the second portion 14 can be further more surely achieved.

Also, in the suspension board with circuit 1, when the thickness T1 of the first portion 13 is above 7 μm and the thickness T2 of the second portion 14 is 7 μm or less, both the broadband of the suspension board with circuit 1 and excellent elasticity of the second portion 14 can be further more surely achieved.

MODIFIED EXAMPLE

In the modified example, the same reference numerals are provided for members and steps corresponding to those described in the first embodiment, and their detailed description is omitted.

As shown in FIG. 1, in one embodiment, the second portion 14 is disposed in a part of the board intermediate portion 8, in addition to the board front end portion 6 and the board rear end portion 7.

Figure 5:
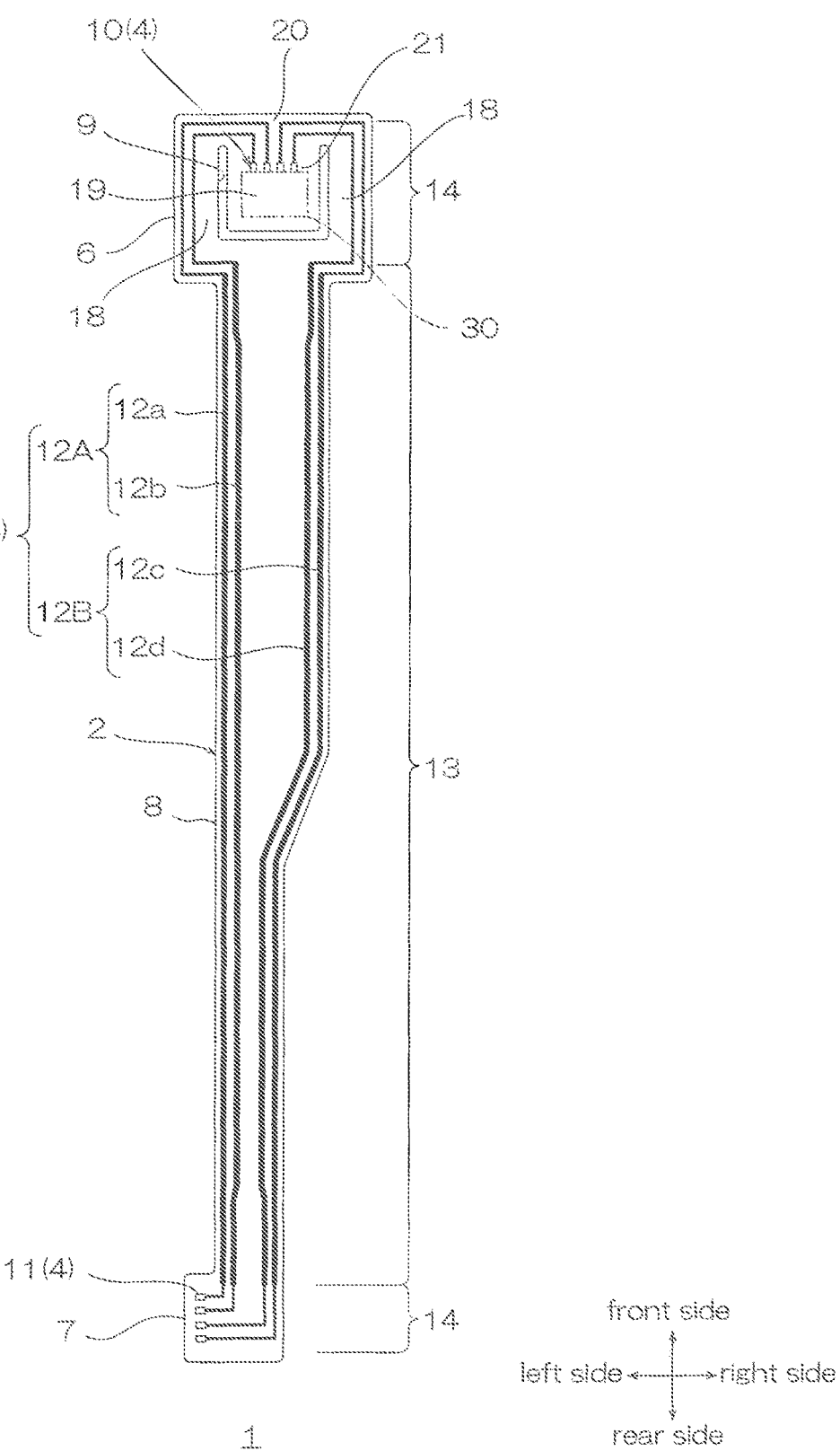
FIG. 5 shows a plan view of a modified example (embodiment in which a second portion is not disposed in the board intermediate portion) of the suspension board with circuit shown in FIG. 1.

However, as shown in FIG. 5, the second portion 14 can be also disposed in only the board front end portion 6 and the board rear end portion 7 without being disposed in the board intermediate portion 8.

Meanwhile, the first portion 13 is disposed over the entire front-rear direction of the board intermediate portion 8.

By the first portion 13, the broadband of the suspension board with circuit 1 can be achieved, while by the second portion 14, the elasticity of the board front end portion 6 and the board rear end portion 7 can be improved, and the miniaturization of the board front end portion 6 and the board rear end portion 7 can be achieved.

Figure 6:
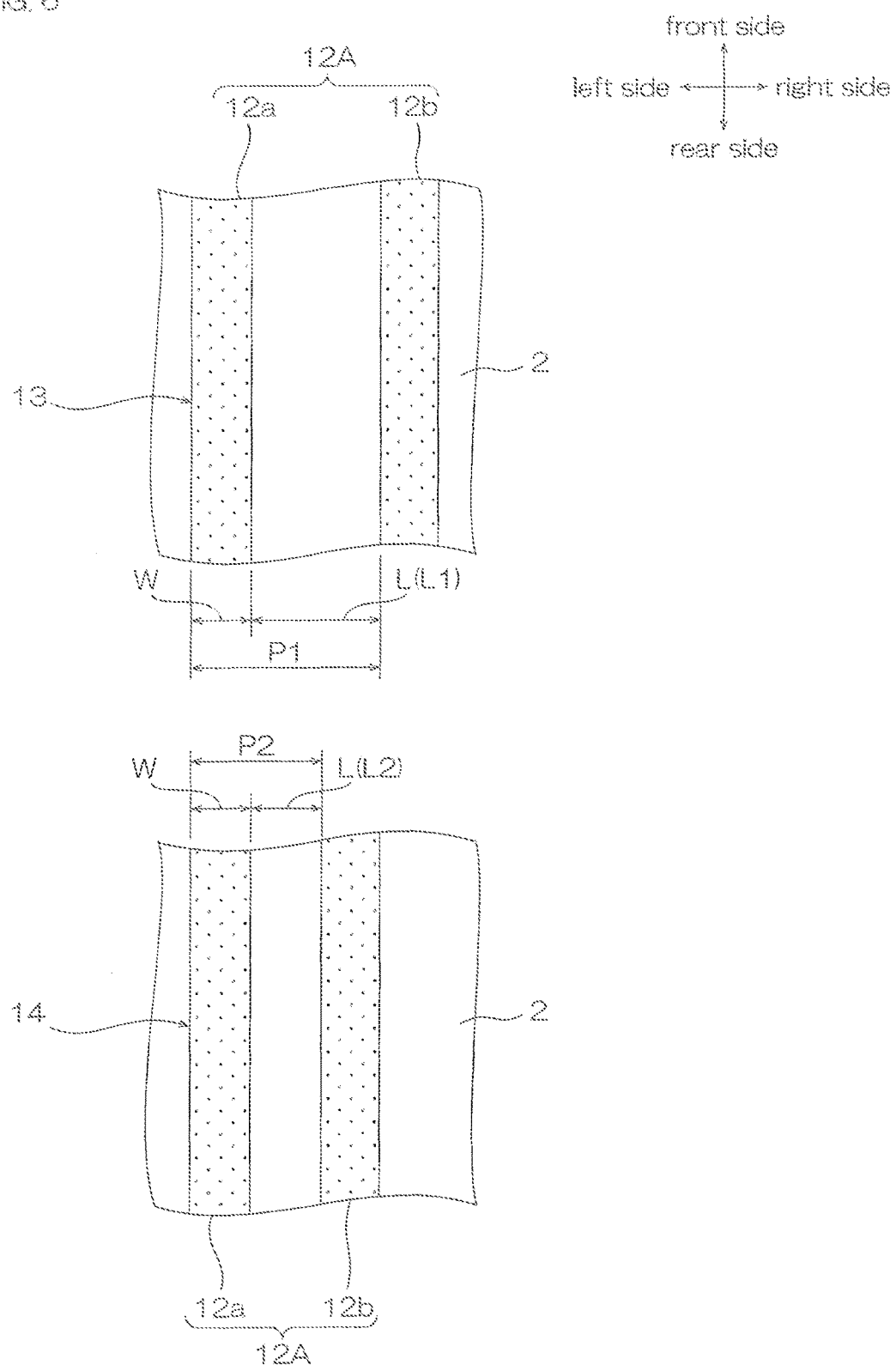
FIG. 6 shows an enlarged plan view of a modified example (embodiment in which the line width in a first portion and the second portion is the same) of one pair of wires shown in FIG. 4, and the upper-side view is a plan view corresponding to FIG. 2 and the lower-side view is a plan view corresponding to FIG. 3.

As shown in FIG. 4, in one embodiment, the line width W2 of the wire 12 in the second portion 14 is small (narrow)

with respect to the line width W1 of the wire 12 in the first portion 13. However, when the above-described pitch P1 in the first portion 13 is above 35 μm and the above-described pitch P2 in the second portion 14 is 35 μm or less, the line width W is not particularly limited. As shown in FIG. 6, for example, the line width W of the wire 12 in the first portion 13 may be the same as the line width W of the wire 12 in the second portion 14, while the interval L1 between the first one pair of wires 12A in the first portion 13 is different from the interval L2 between the first one pair of wires 12A in the second portion 14.

Figure 7:
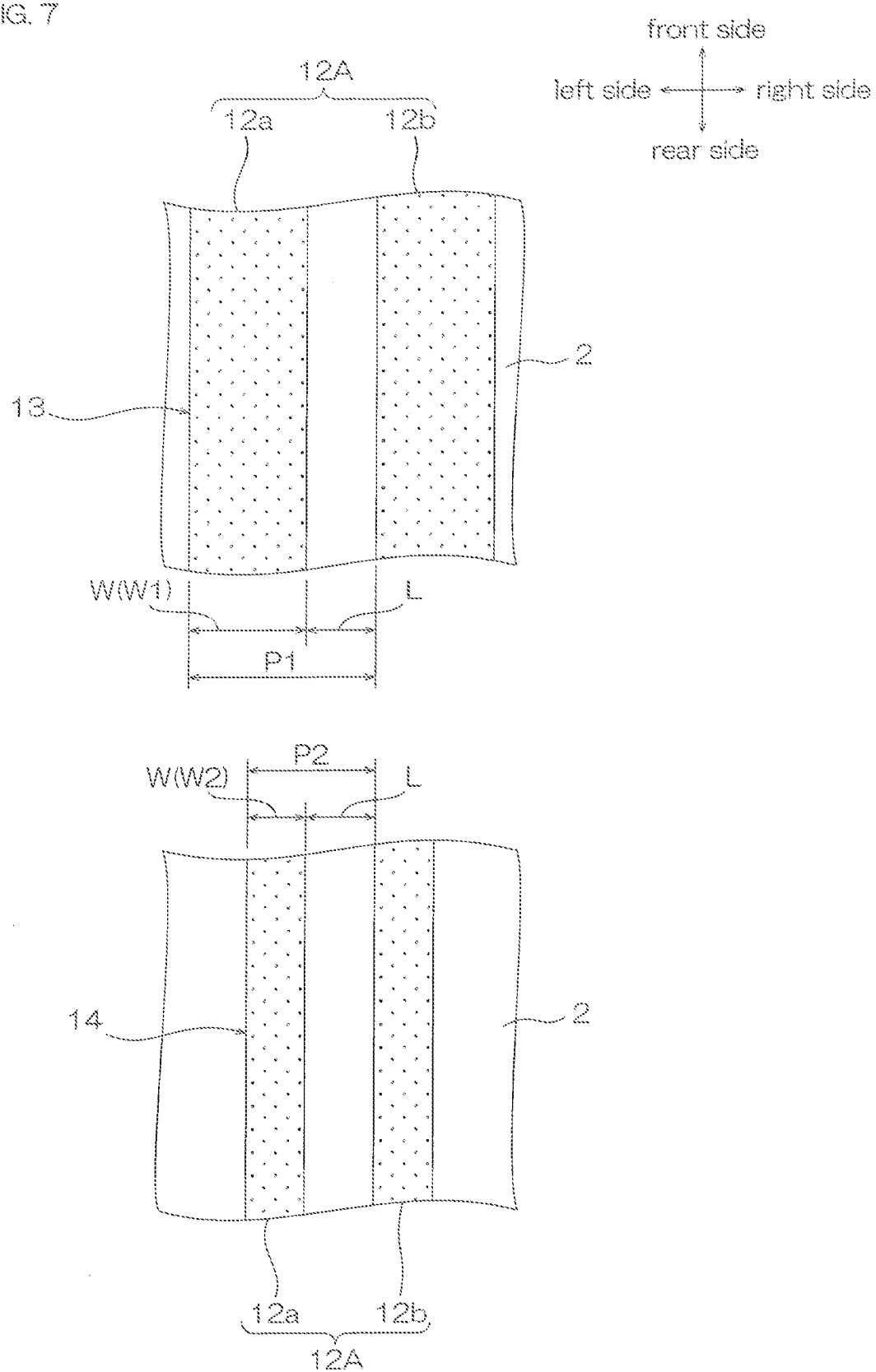
FIG. 7 shows an enlarged plan view of a modified example (embodiment in which the interval in the first portion and the second portion is the same) of one pair of wires shown in FIG. 4, and the upper-side view is a plan view corresponding to FIG. 2 and the lower-side view is a plan view corresponding to FIG. 3.

As shown in FIG. 4, in one embodiment, the interval L2 between the first one pair of wires 12A in the second portion 14 is small (narrow) with respect to the interval L1 between the first one pair of wires 12A in the first portion 13. However, when the above-described pitch P1 in the first portion 13 is larger than the above-described pitch P2 in the second portion 14, the interval L is not particularly limited. As shown in FIG. 7, for example, the interval L between the first one pair of wires 12A in the first portion 13 may be the same as the interval L between the first one pair of wires 12A in the second portion 14, while the line width W1 of the wire 12 in the first portion 13 is different from the line width W2 of the wire 12 in the second portion 14.

In one embodiment, as shown in FIG. 4, the pitch (the total sum of the line width W of one wire 12 of one pair of wires 12 and the interval L between one pair of wires 12) P is described using the plurality of wires 12 having generally straight line shapes when viewed from the top.

Figure 8:
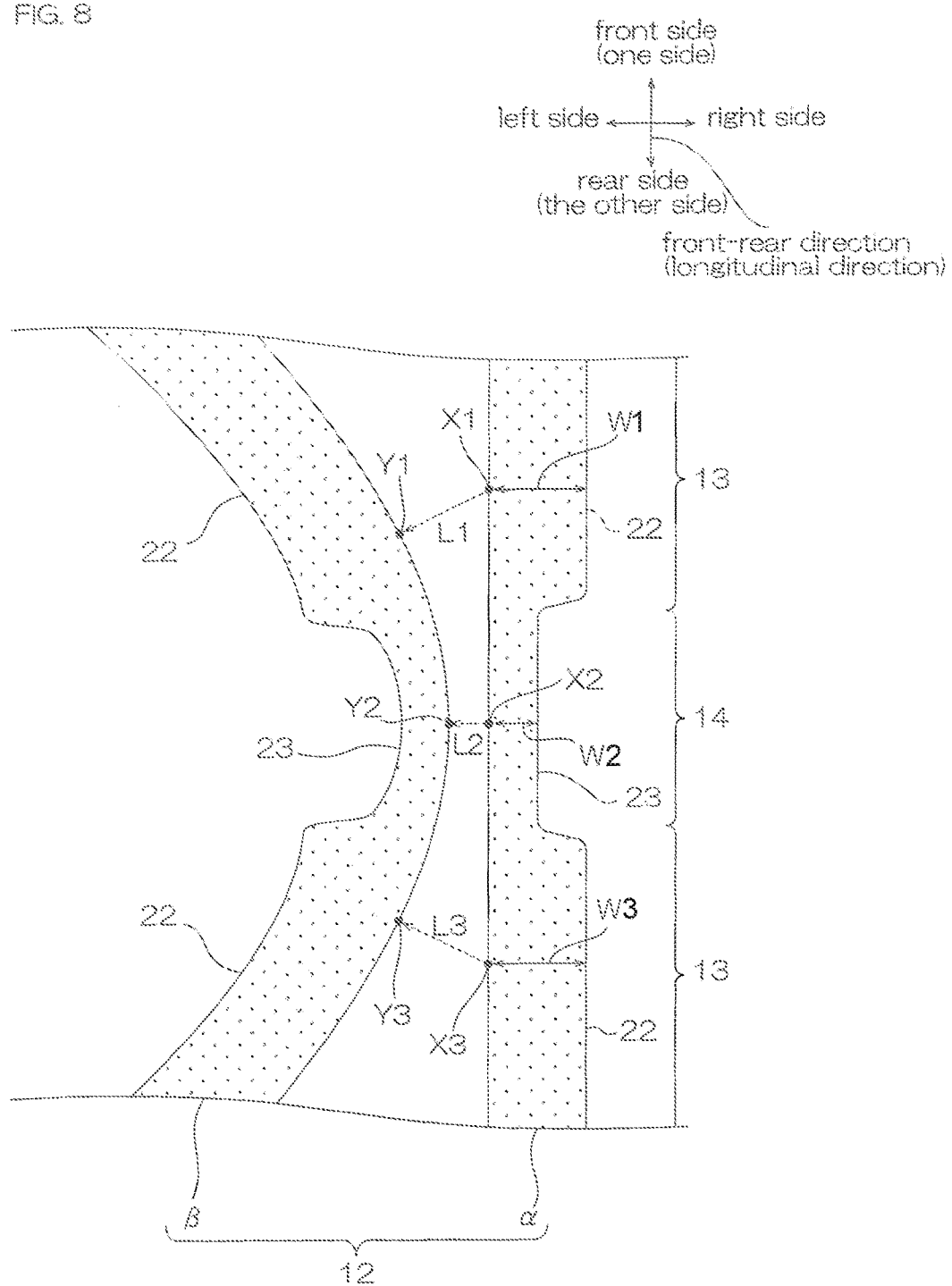
FIG. 8 shows an enlarged view of a modified example (embodiment in which one wire has a generally straight line shape when viewed from the top, and the other wire has a generally curved line shape when viewed from the top) of one pair of wires shown in FIG. 6.

In the modified example, as shown in FIG. 8, the above-described pitch P is described using the plurality of wires 12 in which one wire α has a generally straight line shape when viewed from the top, and the other wire β has a generally curved line shape when viewed from the top of one pair of wires 12.

One wire α has a generally straight line shape when viewed from the top extending in the longitudinal direction. One wire α continuously has a wide portion 22 having a relatively large line width W and a narrow portion 23 having a narrower line width W than the wide portion 22. The line width W of one wire α is the length W in the right-left direction of one wire α.

The other wire β has a generally arch shape (mountain shape) when viewed from the top in which it once gets closer to one wire α from one side toward the other side in the longitudinal direction, and thereafter, is separated therefrom. To be specific, the other wire β has a pattern in which it gradually gets closer to the second portion 14 of one wire α from the other side toward one side in the longitudinal direction when projected in the longitudinal direction, and thereafter, it is separated from the second portion 14 of one wire α further toward one side in the longitudinal direction when projected in the longitudinal direction. The other wire β has the wide portion 22 and the narrow portion 23 that are the same as those of one wire α.

In the modified example shown in FIG. 8, the pitch in one pair of wires 12 is obtained as follows. First, the line width W of one wire α is determined. Next, a shortest-distance portion Y (Y1, Y2, Y3 and so on) in the other wire β that is positioned in the shortest distance from a determined portion X (X1, X2, X3 and so on) in which the line width W is determined in one wire α is determined, and a length (interval) L (L1, L2, L3 and so on) from the determined portion X to the shortest-distance portion Y is obtained. Thereafter, the above-described line width W (W1, W2, W3 and so on) of one wire α is added to the length L from the determined portion X to the shortest-distance portion Y, so that the pitch P in one pair of wires 12 is obtained. The first portion 13 and the second portion 14 in one pair of wires 12 are defined with the pitch P as a reference. To be specific, in one pair of wires 12, the portion in which the above-described pitch P is relatively large (to be more specific, above 35 μm) is the first portion 13, and the portion in which the above-described pitch P is relatively small (to be more specific, 35 μm or less) is the second portion 14.

For example, in the modified example shown in FIG. 8, the wide portion 22 in one wire α and the other wire β is the first portion 13, and the narrow portion 23 in one wire α and the other wire β is the second portion 14.

Figure 9:
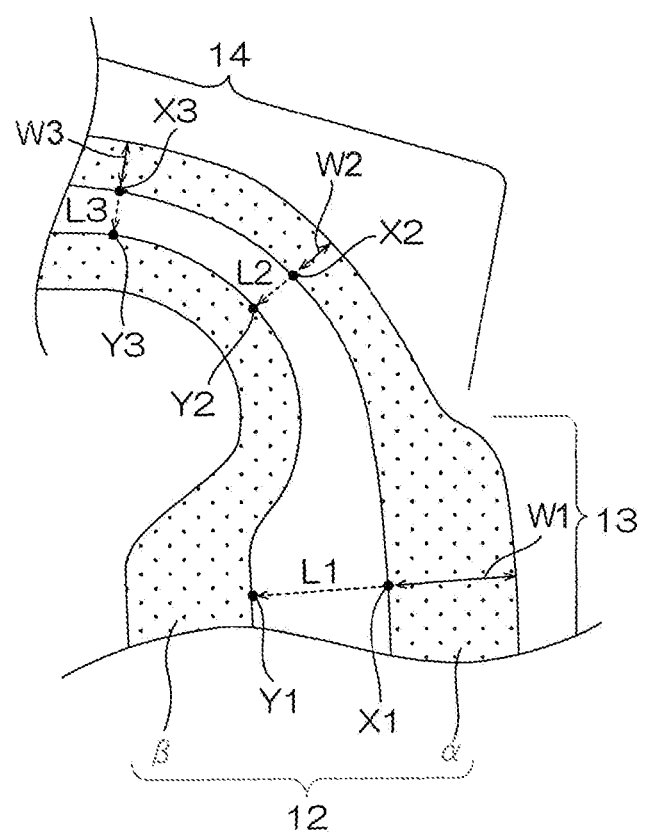
FIG. 9 shows an enlarged view of a modified example (embodiment in which both of one pair of wires have a generally curved line shape when viewed from the top) of one pair of wires shown in FIG. 6.

Furthermore, as shown in FIG. 9, the above-described pitch P can be also described using one pair of wires 12 both having generally curved line shapes when viewed from the top.

As shown in FIG. 9, one pair of wires 12 have one wire α and the other wire β that is disposed at the inside thereof. Both of one pair of wires 12 bend (curve) in one direction as they go. One wire α integrally has the wide portion 22 and the narrow portion 23. The other wire β integrally has the wide portion 22 and the narrow portion 23.

The wide portion 22 of one wire α and the wide portion 22 of the other wire β are disposed next to each other. The narrow portion 23 of one wire α and the narrow portion 23 of the other wire β are disposed next to each other.

In the modified example shown in FIG. 9, the pitch in one pair of wires 12 is obtained as follows. First, the line width W of one wire α is determined. Next, a shortest-distance portion Y (Y1, Y2, Y3 and so on) in the other wire β that is positioned in the shortest distance from a determined portion X (X1, X2, X3 and so on) in which the line width W is determined in one wire α is determined, and a length (interval) L (L1, L2, L3 and so on) from the determined portion X to the shortest-distance portion Y is obtained. Thereafter, the above-described line width W (W1, W2, W3 and so on) of one wire α is added to the length L from the determined portion X to the shortest-distance portion Y, so that the pitch P in one pair of wires 12 is obtained. The first portion 13 and the second portion 14 in one pair of wires 12 are defined with the pitch P as a reference. To be specific, in one pair of wires 12, the portion in which the above-described pitch P is relatively large is the first portion 13, and the portion in which the above-described pitch P is relatively small is the second portion 14.

For example, in the modified example shown in FIG. 9, the wide portion 22 in one wire α and the other wire β is the first portion 13, and the narrow portion 23 in one wire α and the other wire β is the second portion 14.

In the above-described one embodiment, the wired circuit board of the present invention is described as the suspension board with circuit 1. However, for example, as the wired circuit board, a flexible wired circuit board that includes a reinforcement layer at the rear surface thereof can be also used. Or, as the wired circuit board, a flexible wired circuit board that does not include a reinforcement layer can be also used.

In one embodiment, the first one pair of wires 12a are read wires and the second one pair of wires 12B are write wires, and the relationship can be reversed. Also, each of the first one pair of wires 12A may be the read wire and the write wire, and each of the second one pair of wires 12B may be the read wire and the write wire.

In one embodiment, the first portion 13 corresponding to the first one pair of wires 12A and the first portion 13 corresponding to the second one pair of wires 12B are positioned at substantially the same position, when projected in the right-left direction. Alternatively, for example, though not shown, the first portion 13 corresponding to the first one pair of wires 12A and the first portion 13 corresponding to the second one pair of wires 12B can be also disposed at different positions. Also, the second portion 14 corresponding to the first one pair of wires 12A and the second portion 14 corresponding to the second one pair of wires 12B can be disposed at different positions, when projected in the right-left direction.

In the above-described one embodiment, the wire 12 has one pair of wires 12 in two sets. However, the number of sets is not particularly limited. For example, the wire 12 can have one pair of wires 12 in three or more sets. Alternatively, the wire 12 can only have one pair of wires 12 in one set.

In each of the modified examples described above, the same function and effect as that of one embodiment can be achieved.

One embodiment and each of the modified examples described above can be appropriately used in combination. While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A wired circuit board comprising:
an insulating layer and
a plurality of wires disposed at one-side surface in a thickness direction of the insulating layer at spaced intervals to each other, wherein
the plurality of wires have one pair of wires in parallel,
the plurality of wires continuously have in a longitudinal direction in which each of the plurality of wires extends:
a first portion, and
a second portion in which the total sum of a line width of one wire of one pair of wires and an interval between one pair of wires is smaller than that of the first portion, where the line width is in a width direction that is perpendicular to the longitudinal direction, and
a thickness T1 of the first portion is large with respect to a thickness T2 of the second portion, where the thickness T1 and the thickness T2 are in a direction that is perpendicular to the longitudinal direction and the width direction.

2. The wired circuit board according to claim 1, wherein the total sum of the first portion is above 35 μm.

3. The wired circuit board according to claim 1, wherein the total sum of the second portion is 35 μm or less.

4. The wired circuit board according to claim 1, wherein the ratio (T1/T2) of the thickness T1 to the thickness T2 is 1.1 or more.

5. The wired circuit board according to claim 1, wherein the thickness T1 is above 7 μm and the thickness T2 is 7 μm or less.

\* \* \* \* \*